(12) United States Patent
Reiha

(10) Patent No.: US 9,450,557 B2
(45) Date of Patent: Sep. 20, 2016

(54) PROGRAMMABLE PHASE SHIFTER WITH TUNABLE CAPACITOR BANK NETWORK

(71) Applicant: Nokia Corporation, Espoo, Nokia Group (FI)

(72) Inventor: Michael Thomas Reiha, El Cerrito, CA (US)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/136,752

(22) Filed: Dec. 20, 2013

(65) Prior Publication Data
US 2015/0180439 A1    Jun. 25, 2015

(51) Int. Cl.
| | |
|---|---|
| *H01P 1/18* | (2006.01) |
| *H03H 7/18* | (2006.01) |
| *H03H 7/20* | (2006.01) |
| *H01Q 3/36* | (2006.01) |

(52) U.S. Cl.
CPC .............. *H03H 7/185* (2013.01); *H01P 1/184* (2013.01); *H01Q 3/36* (2013.01); *H03H 7/20* (2013.01)

(58) Field of Classification Search
CPC ...... H03H 1/185; H03H 1/888; H03H 1/184; H03H 7/185; H03H 7/20; H03H 3/36; H01P 1/184
USPC ............... 333/161, 164, 156, 139, 262, 138; 439/676, 941
See application file for complete search history.

(56) References Cited

U.S. PATENT DOCUMENTS

| | | | |
|---|---|---|---|
| 5,424,696 A | 6/1995 | Nakahara et al. | |
| 5,673,009 A * | 9/1997 | Klas et al. | ........................ 333/1 |
| 5,757,319 A * | 5/1998 | Loo et al. | ...................... 342/375 |
| 5,931,703 A * | 8/1999 | Aekins | ........................... 439/676 |
| 6,903,623 B2 * | 6/2005 | Jain | ........................... H01P 1/15 333/103 |
| 7,102,455 B2 * | 9/2006 | Lin et al. | ........................... 333/1 |
| 7,232,959 B2 * | 6/2007 | Hsu | ............... 174/261 |
| 8,717,138 B2 * | 5/2014 | Kossel et al. | ................. 336/200 |
| 2014/0266490 A1 * | 9/2014 | Xiao et al. | ......................... 333/1 |

FOREIGN PATENT DOCUMENTS

| | | |
|---|---|---|
| JP | 410209788 A * | 8/1998 |
| WO | WO-2011/034511 A1 | 3/2011 |

OTHER PUBLICATIONS

Chun, Young-Hoon et al. "A Novel Tunable Transmission Line and Its Application to a Phase Shifter", IEEE Microwave Wireless Components Letters, IEEE Service Center. New York, NY, US. vol. 15, No. 11. Nov. 1, 2005.

Borgioli, Andrea et al. "Low-Loss Distributed MEMS Phase Shifter". IEEE Microwave and Guided Wave Letters, IEEE Inc., New York, US. vol. 10, No. 1. Jan. 1, 2000.

(Continued)

*Primary Examiner* — Dinh T Le
(74) *Attorney, Agent, or Firm* — Mintz Levin Cohn Ferris Glovsky and Popeo, P.C.

(57) ABSTRACT

Methods and apparatus, including computer program products, are provided for a programmable phase shifter. In some example embodiments, there is provided an apparatus. The apparatus may include a transmission line comprising a plurality of sections; and a plurality of switches coupled to the plurality of sections, wherein the plurality of switches activate one or more of the plurality of sections to vary a phase shift provided by the transmission line, and wherein the plurality of switches configure a type of coupling between one or more of the sections to vary an impedance provided by the transmission line. Related apparatus, systems, methods, and articles are also described.

17 Claims, 16 Drawing Sheets

(56) References Cited

OTHER PUBLICATIONS

Reiha, M., "Silicon-based Broadband Amplifier Design," Wohrmann, Zutphen (2010).

Amari, S. and U. Rosenberg, "Synthesis and Design of Novel In-Line Filters with One or Two Real Transmission Zeros," IEEE Trans. Microwave Theory Tech. 47:1464-1478 (2004).

Long, J. and M. Copeland, "The modeling, characterization, and design of monolithic inductors for Silicon RF C's," IEEE Journal of Solid-State Circuits 32:357-369 (1997).

Cameron, R., "General coupling matrix synthesis methods for Chebyshev filtering functions," IEEE Trans. Microwave Theory Tech. (47):433-442 (1999).

\* cited by examiner

PROGRAMMABLE PHASE SHIFTER WITH TUNABLE CAPACITOR BANK NETWORK

FIELD

The subject matter described herein relates to tunable filters.

BACKGROUND

Generally, discrete fixed radio frequency (RF) filters are costly, large, and cover a narrow frequency range. However, in some radio technologies, such as in Long Term Evolution (LTE), the RF front-end may include a plurality of bands, such as over 29 frequency division duplexing (FDD) bands and over 11 time division duplexing (TDD) bands as defined by for example the Third Generation Partnership Project (3GPP). As such, tunable filters, rather than discrete fixed filters, may provide a way to cover these bands. Moreover, the tunable filter may implement a phase shifter to tune over the wide range of frequencies associated with these bands.

Phase shifters based on capacitively loaded transmission lines may be narrow band. As such, when the phase shift is increased, the characteristic impedance of the capacitively loaded transmission lines may decrease. This type of phase shifter may be difficult to interface to bandpass resonators because these bandpass resonators may be predefined for a specific fractional bandwidth and center frequency. Alternatively or additionally, switched-line phase shifters may be used in a tunable filter, but switched-line phase shifter may be limited by the number of independent transmission lines needed to support the combination of coarse phase shift (Phi) and coarse characteristic impedance (Zo)—limiting thus the phase shifter's frequency of operation.

FIG. 16 depicts a typical switched-line phase shifter configured to selects one of two transmission lines to perform coarse phase-shifting. This type of phase shifter may use a transmission line for independent coarse phase shift (Phi) and a transmission line for coarse characteristic impedance (Zo). As a result, supporting multiple Zo and Phi states may require the use of bulky, higher-order multi-throw switch matrices, such as the single pole, four throw switch (labeled $S_1$ and $S_2$) depicted at FIG. 16, and may require an area intensive set of transmission lines.

SUMMARY

Methods and apparatus, including computer program products, are provided for a programmable phase shifter.

In some example embodiments, there is provided an apparatus. The apparatus may include a transmission line comprising a plurality of sections; and a plurality of switches coupled to the plurality of sections, wherein the plurality of switches activate one or more of the plurality of sections to vary a phase shift provided by the transmission line, and wherein the plurality of switches configure a type of coupling between one or more of the sections to vary an impedance provided by the transmission line.

In some variations, one or more of the features disclosed herein including the following features can optionally be included in any feasible combination. One or more variable capacitors may be coupled to the transmission line. The one or more variable capacitors may be coupled at about a midpoint of the transmission line. The type of coupling may include a straight through coupling, a cross coupling, or a combination of both. The plurality of apparatus may be concatenated in a series electrical connection each including a mid-point tunable load capacitor, wherein the plurality of apparatus comprise a tunable inductor.

The above-noted aspects and features may be implemented in systems, apparatus, methods, and/or articles depending on the desired configuration. The details of one or more variations of the subject matter described herein are set forth in the accompanying drawings and the description below. Features and advantages of the subject matter described herein will be apparent from the description and drawings, and from the claims.

Figure 1:
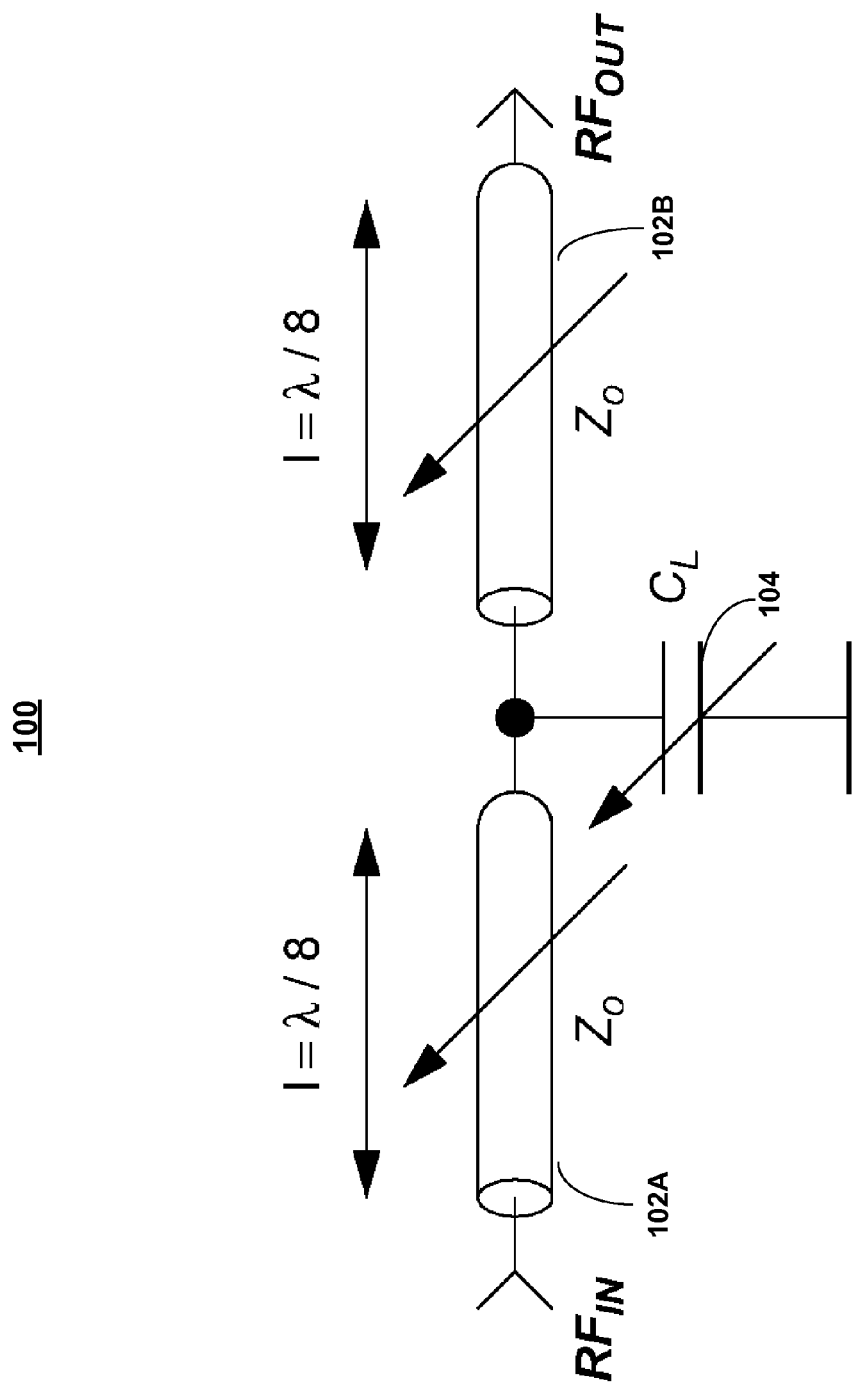
FIG. 1 depicts an example of a block diagram of a model of the phase shifter, in accordance with some example embodiments.

Like labels are used to refer to same or similar items in the drawings.

DETAILED DESCRIPTION

In some example embodiments, there may be provided a phase shifter comprising transmission lines coupled to switches to enable reconfiguration of the transmission lines and corresponding selections of characteristic impedance, Zo, and of phase shift, Phi. For example, the phase shifter disclosed herein may be coarsely adjusted in both phase shift and characteristic impedance levels, and this adjustment may be performed independently to phase shift and to impedance levels by reconfiguring the periodic transmission lines via the switches. Moreover, the structure of the phase shifter comprising transmission lines and switches may, in some example embodiments, provide a periodic layout structure, which may facilitate reconfigurability of the transmission lines and implementation on for example a chip.

In some example embodiments, there may be provided a bandpass filter including the phase shifter. For example, the phase shifter may provide a tunable bandpass filter, which may be used in a variety of frameworks including bands associated with Long Term Evolution (LTE), although other radio technologies may include the disclosed bandpass filter including phase shifter.

In some example embodiments, the disclosed transmission line structure may, in some example embodiments, comprise a tunable inductor.

In some example embodiments, there may be provided a phase shifter comprising transmission lines coupled to switches to enable reconfiguration of the transmission lines and corresponding selections of characteristic impedance, Zo, and of phase shift, Phi. For example, the phase shifter disclosed herein may be coarsely adjusted in both phase shift and characteristic impedance levels, and this adjustment may be performed independently to phase shift and to impedance levels by reconfiguring the periodic transmission lines via the switches. Moreover, the structure of the phase shifter comprising transmission lines and switches may, in some example embodiments, provide a periodic layout structure, which may facilitate reconfigurability of the transmission lines and implementation on for example a chip.

In some example embodiments, there may be provided a switched-line phase shifter having a tunable capacitor bank network provided by a combination of a network of broadband transmission lines that may maintain characteristic impedance over a wider bandwidth. The broadband transmission line structure may be coarsely adjusted in both phase shift and characteristic impedance levels independently. This coarse adjustment may be provided by re-configuring the periodic transmission-line structure. Consequently, an increased amount of combinations of, for example, Zo and Phi may be provided, without resorting to lossier higher-order multi-throw switches. Moreover, tunable capacitors may be included for fine-tuning. Furthermore, a tunable inductor may also be provided. This tunable inductor may enable a tunable filter.

FIG. 1 depicts an example of a block diagram of a model of the phase shifter 100, in accordance with some example embodiments. The phase shifter may include a broadband tunable quarter-wavelength (λ/4) resonator transmission line 102A-B intersected by a network of one or more tunable shunt capacitors 104, which may be centered at the transmission line 102A-B. The phase shifter 100 may form a filter-tee network, which represents a tunable inductor.

Figure 2:
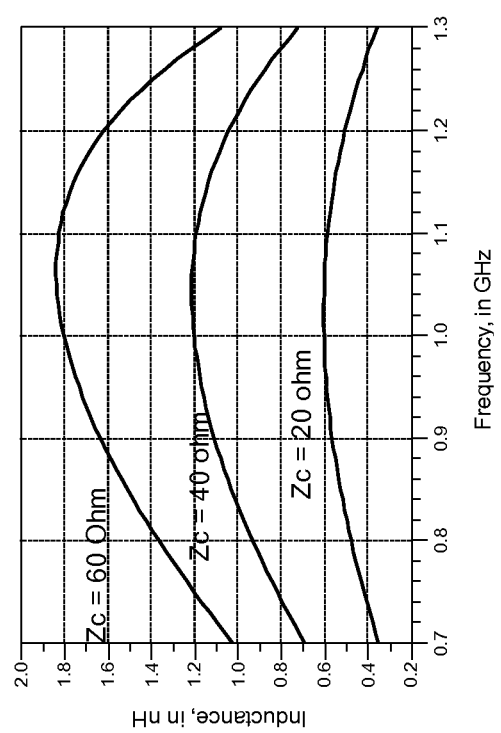
FIG. 2 depicts a plot of simulated inductance values for the tunable phase shifter of FIG. 1.

FIG. 2 plots simulated inductance values for the tunable phase shifter of FIG. 1. FIG. 2 depicts an array of inductance values for a variety of transmission line characteristic impedance values at a shunt capacitance, $C_L$ 104, of for example, 0.5 picofarads (pF), although other capacitance values may be used as well. When this is the case, the inductance values are plotted using a system impedance, Zc (for example, about 50Ω), equal to about the characteristic impedance, Zo, of the phase shifter 100.

Figure 3:
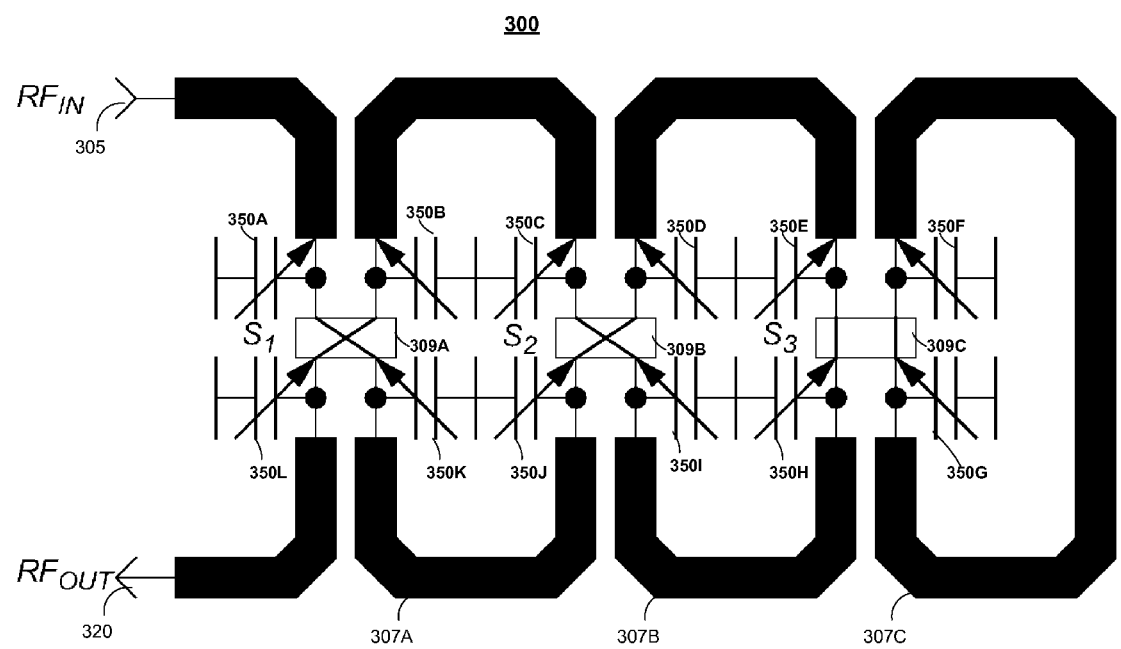
FIG. 3 depicts an example of a half section of tunable transmission line, in accordance with some example embodiments.

FIG. 3 depicts an example half section of tunable transmission line 300, in accordance with some example embodiments. This half section may be used at each of the half sections 102A-102B of tunable quarter-wavelength (λ/4) resonator transmission line depicted at FIG. 1. Although FIG. 3 depicts three sections, other quantities of transmission line sections may be used as well.

In the example of FIG. 3, the half section tunable transmission line (l=λ/8) may include an RF input 305, a transmission line structure comprised of three sections 307A-C, one or more switches coupling each of the sections and/or the top and bottom portions of the transmission line structure, and an RF output 320. The electrical length of the transmission line structure may be coarsely controlled by selecting a quantity of coupled sections 307A-C to add to the RF path between the RF input 305 to the RF output 320. Changing the length of the RF path effectively changes the phase shift (Phi) provided by half section tunable transmission line 300.

One or more of the sections 307A-B may be coupled into the RF path from RF input 305 to RF output 320 via switches 309A-C. By controlling the activation of switches 309A-C and thus the addition of one or more transmission line sections, the electrical length of half section tunable transmission line 300 may be controlled, which corresponds to the amount of phase shift (Phi) provided by half section tunable transmission line 300. The switches $S_1$-$S_3$ 309A-C may also provide a coarse control of the characteristic impedance, $Z_O$, provided by the RF path (for example, the RF path from RF input 305 to RF output 320) in which the RF current propagates through the transmission line. Fine control of the characteristic impedance, $Z_O$, may, in some example embodiments, be provided by the variable capacitors 350A-L.

Figure 4:
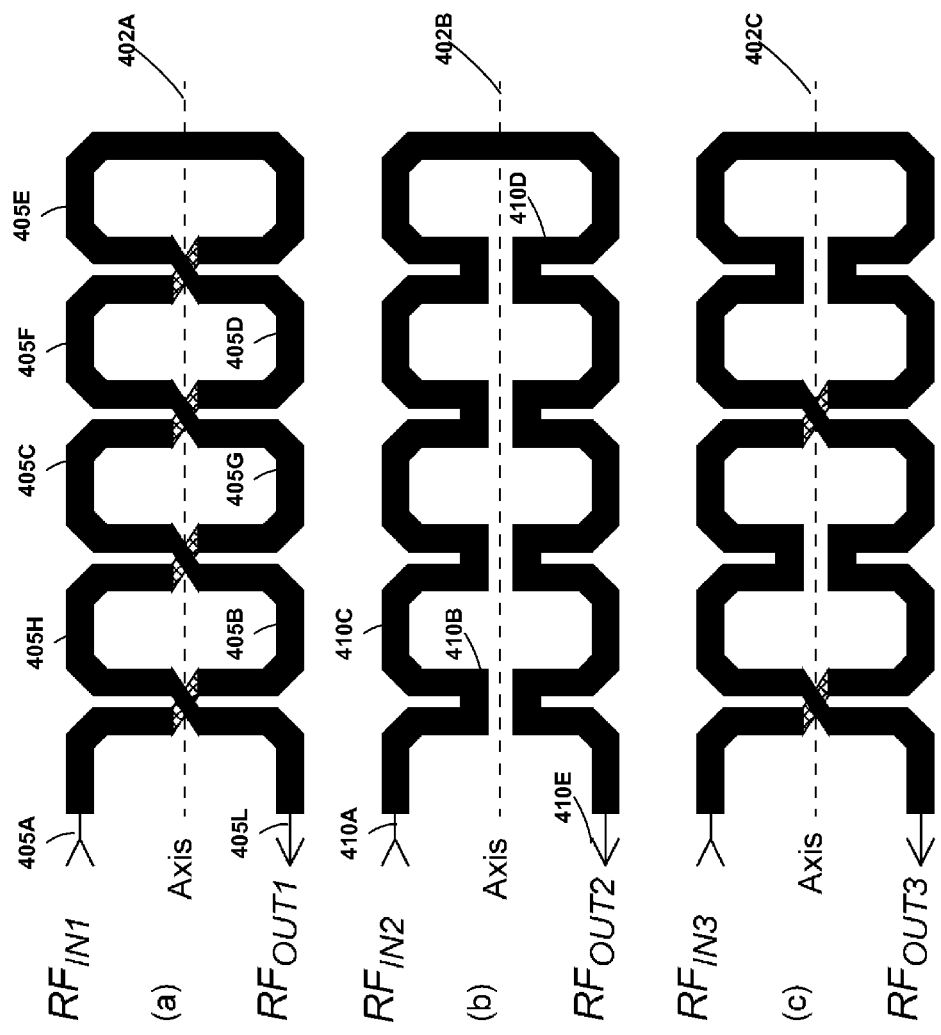
FIG. 4 depicts additional example configurations of the half section tunable transmission lines, in accordance with some example embodiments.

FIG. 4 depicts additional example configurations of the half section tunable transmission lines, in accordance with some example embodiments. The different configurations (a)-(c) may be provided by configuring the one or more switches, which may be placed along the axis 402A-C. Although FIG. 4 depicts four sections, other quantities of transmission line sections may be used as well.

FIG. 4(a) depicts a cross configuration of switches providing a path 405A-L. FIG. 4(b) illustrates a series configuration of switches providing a path 410A-E. In the configuration of FIG. 4(b), the series-coupled line 410A-E provides an RF current path that does not cross the axis of symmetry. FIG. 4(c) depicts a mixed-coupled structure having cross-coupled connections and series-coupled connections. In the aforementioned coupling schemes at FIG. 4(a)-(c), the RF sections may be coupled into (or out of the path) to coarsely control the transmission line's phase shift (Phi) and characteristic impedance, $Z_O$. The characteristic impedance, $Z_O$, at FIG. 4 may be finely adjusted, in some example embodiments, by varying the capacitance values that load each cross-section (not shown in FIG. 4 but shown at FIG. 3 at 350A-L).

Figure 5:
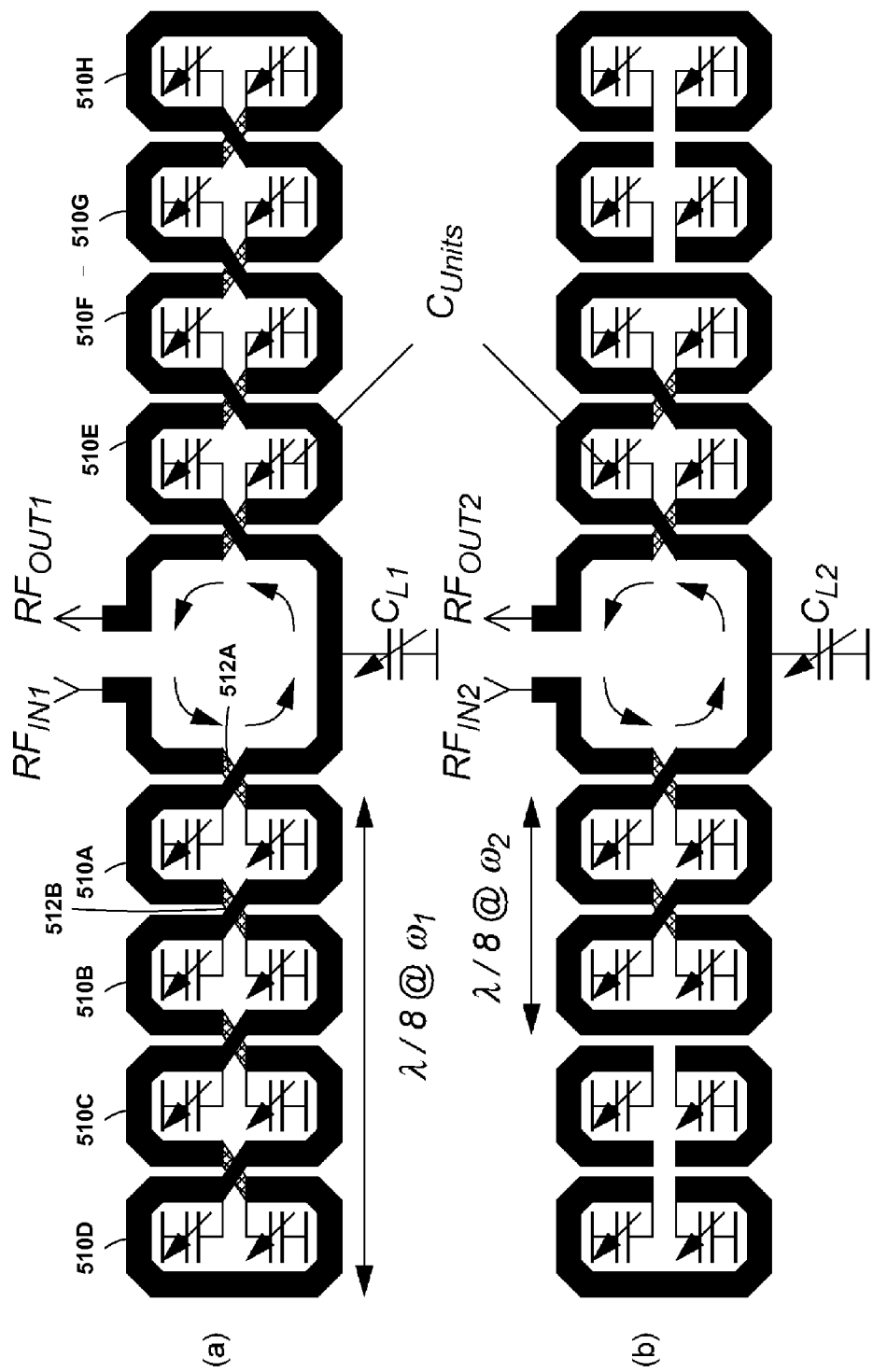
FIG. 5 depicts other example implementations of the phase shifter, in accordance with some example embodiments.

FIG. 5 depicts other example implementations of the phase shifter, in accordance with some example embodiments. FIG. 5(a) depicts a constant impedance phase shifter using four sections per half circuit, and FIG. 5B depicts two sections per half-circuit. When the electrical length of the transmission line is changed while substantially maintaining the characteristic impedance, $Z_O$, the phase shifter may operate over a wider range of coarse frequencies. This may enable the phase shifter to be used as a tunable filter to operate over one or more RF bands.

Referring again to FIG. 5(a), all eight transmission line sections 510A-H are activated via the switches 512A-H, when compared to FIG. 5(b) where only four sections are activated (for example, coupled into the transmission line path). In both examples, the phase shifters share approximately the same characteristic impedance, $Z_O$, which may be fined tuned via switching the unit capacitors, $C_{Units}$. This may allow inductance values to be synthesized and tuned over a wide range of frequencies.

Figure 6:
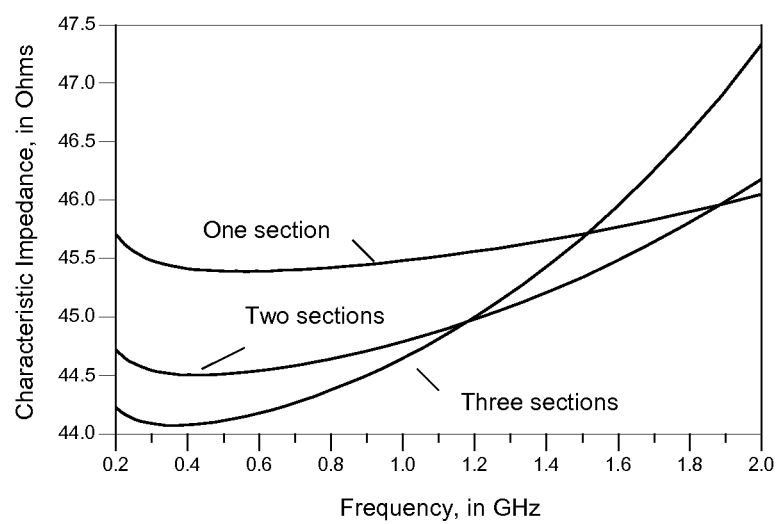
FIGS. 6-7 depict example plots of impedance and phase shift.

FIG. 6 illustrates the characteristic impedance, $Z_O$, of the configuration shown in FIG. 5 for one, two, and three activated sections, respectively, and illustrates that the values of characteristic impedance, $Z_O$ may be approximately equal, through this coarse tuning procedure.

Figure 7:
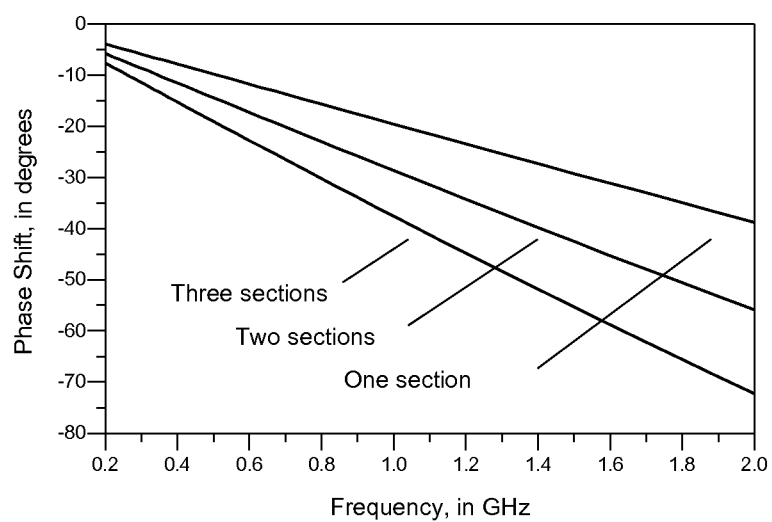

FIG. 7 illustrates the corresponding phase shift of the configuration shown in FIG. 5 for one, two, and three sections. FIG. 7 depicts that the phase shift provided may be linear (for example, dispersionless) and/or broadband operating over wide frequency range). The characteristic impedance coarse tuning may maintain the same number of sections but use different coupling schemes as shown for example at FIG. 5 where one, two, or three section coupling and corresponding impedance is plotted.

Figure 8:
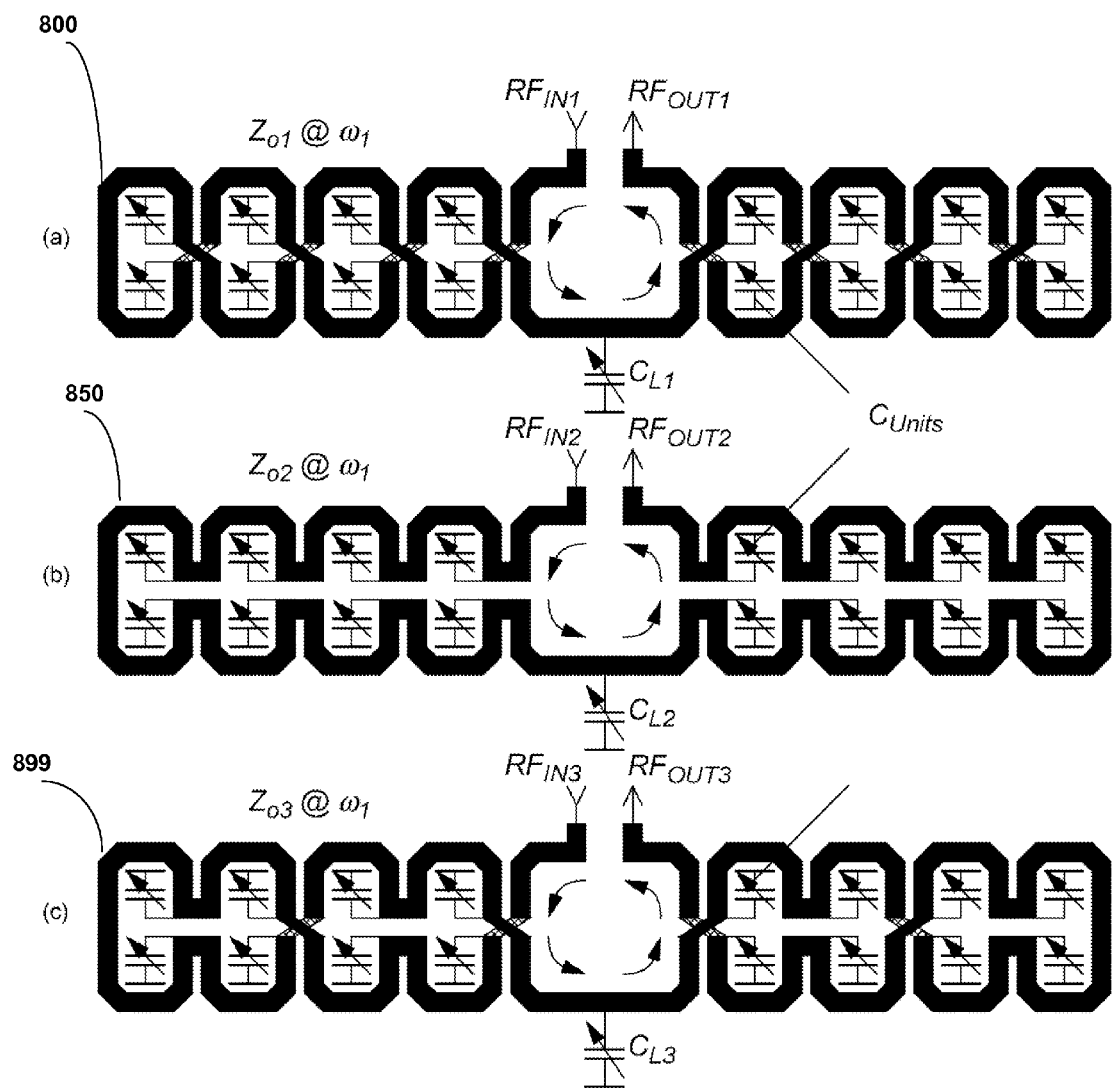
FIG. 8 depicts phase shifter circuits having four sections per half circuit, in accordance with some example embodiments.

FIG. 8 depicts phase shifter circuits having four sections per half circuit, in accordance with some example embodiments. FIG. 8(a) depicts a phase shifter circuit 800 having a cross-configuration; FIG. 8(b) depicts a phase shifter circuit 850 having straight line; FIG. 8(c) depicts a phase shifter circuit 899 having mixed-coupling of cross and straight. As such, the periodic nature of the transmission line segments enables the phase shifter to be (re-)configured in a variety of propagation modes, such as the cross, straight, and mixed depicted at FIG. 8. This reconfiguration may allow selection of different phase shifts and/or characteristic impedances.

The net inductance (which is used to calculate the characteristic impedance) may be a function of the magnetic coupling factor between the narrowly spaced metal conductors of the transmission line sections.

In the cross-coupling mode of, for example, FIG. 8(a), the inductance, L, of each of the closely spaced conductors may be determined according to the following equation:

$$L = L_S(1+k_m) \quad \text{Equation (1),}$$

wherein $L_S$ is the self-inductance of the conductor, and $k_m$ is the magnetic coupling factor between the closely-spaced conductors.

In the straight-mode of for example FIG. 8(b), coupling may yield a negative mutual magnetic coupling. Therefore, the inductance, L, of each of the closely spaced conductors may be determined according to the following equation:

$$L = L_S(1-k_m) \quad \text{Equation (2).}$$

In the mix-coupling mode of FIG. 8(c), it may yield a net inductance that is a combination of Equations (2) and (3), so this net inductance may be between the two extremes of Equations 2 and 3. The characteristic impedance, Zo, for the mixed coupling mode as depicted in for example FIG. 8C may be approximated by the following equation:

$$Zo = (L/C_T)^{1/2} \quad \text{Equation (3),}$$

wherein $C_T$ is the total line capacitance of the half-circuit dominated by the tunable unit capacitors $C_{Units}$. The physical vertical spacing and horizontal spacing between coupling sections may be configured to be at least ten times the conductor width in order to mitigate parasitic magnetic couplings.

Figure 9:
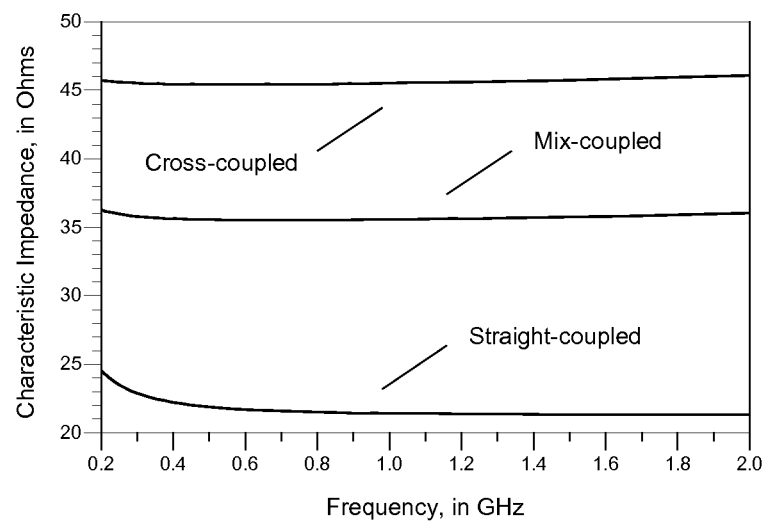
FIG. 9 depicts the coarse characteristic impedance levels for the phase shifter circuits at FIG. 8.

FIG. 9 depicts the coarse characteristic impedance levels for the phase shifter circuits at FIG. 8(a-c). FIG. 9 shows an approximate doubling of the characteristic impedance may be achieved by switching from a straight-coupled to a cross-coupled phase shifter. The mix-coupled phase shifter may provide a coarse impedance level that is approximately the arithmetic average between straight-coupled and cross-coupled states.

In some example embodiments, the characteristic impedance may be varied by changing the configuration of the sections, such as from straight, cross, or a combination thereof as shown for example at FIG. 8. Moreover, adding sections, as noted above at FIG. 5, may change the phase shift. As such, characteristic impedance, Zo, and the amount of phase shift, Phi, may be varied. Moreover, characteristic impedance, Zo, and the amount of phase shift, Phi, may be independently varied.

Figure 10:
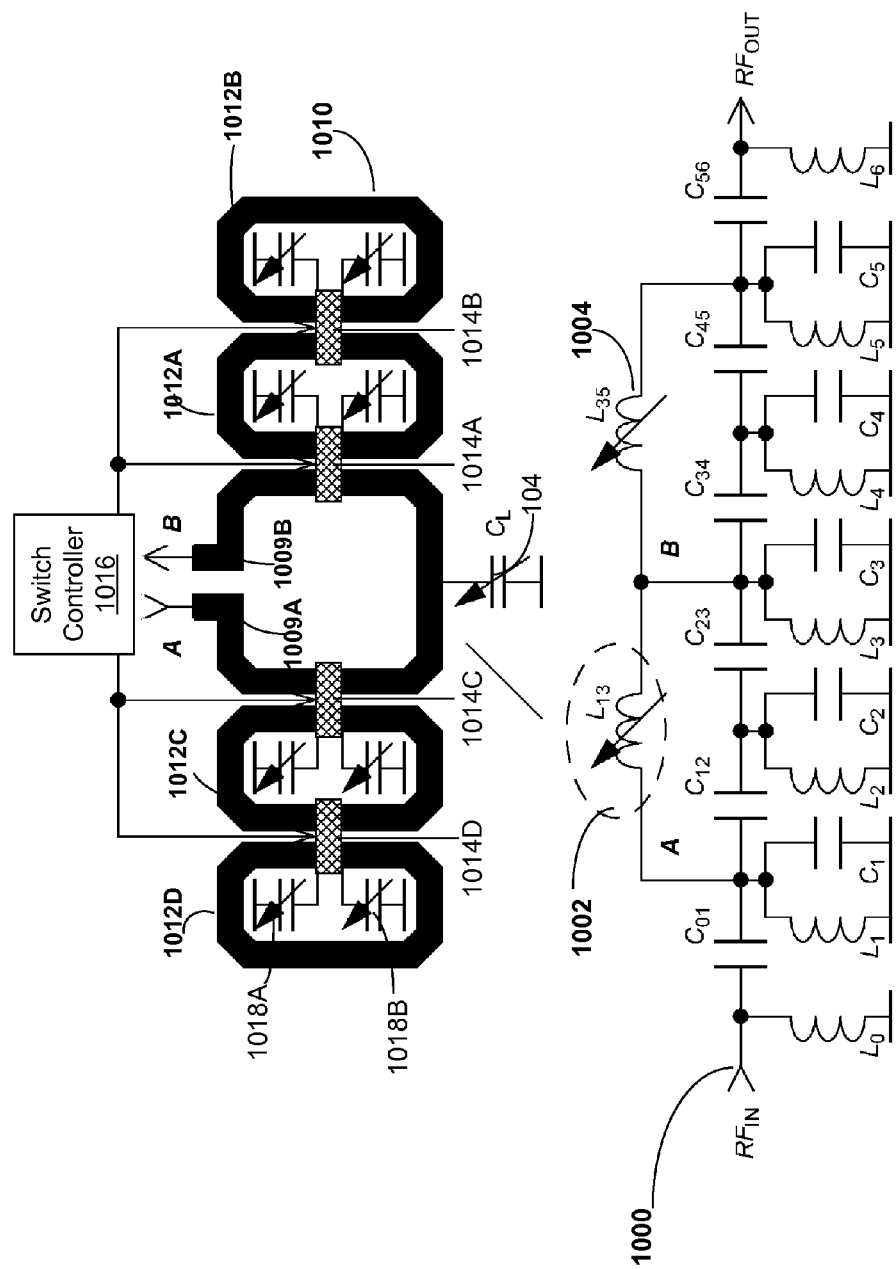
FIG. 10 depicts an example of a band filter including the tunable phase shifter, in accordance with some example embodiments.

FIG. 10 depicts an example of a band filter 1000 including the tunable phase shifter 1010, in accordance with some example embodiments. The tunable phase shifter 1010 may be implemented as a tunable inductor at tunable inductor, $L_{13}$ 1002 and/or tunable inductor, $L_{35}$ 1004.

In the example of FIG. 10, tunable phase shifter 1010 may include an RF input 1009A, four transmission line sections 1012A-C, and switches 1014A-D, and an RF output 1009B. The switches 1014A-D may be under the control of a controller 1016. Moreover, the switches 1014A-D may couple each of the sections into and out of the transmission line path from input 1009A to output 1009B (which may coarsely vary the phase shift), and switches 1014A-D may change the characteristic impedance as well by implementing a cross-configuration, straight, or mixed as noted above. Moreover, the sections may include a variable capacitor 1018A, B, and so forth to finely adjust both the characteristic impedance and phase shift. In addition, variable capacitor 104 may be used to synthesize a tunable inductance, in tandem with the phase shifter sections.

Although FIG. 10 depicts tunable phase shifter 1010 being used as a band filter 1000 for a Long Term Evolution transmit band-pass filter, tunable phase shifter 1010 and/or tunable band filter 1000 may be used in other frequency bands and/or in a receive band as well.

Referring to FIG. 10, the inductance values $L_{13}$ 1002 and $L_{35}$ 1004 may form a feed-forward path allowing for tunable transmission zeros for out-of-band high-side rejection. For example, the inductance value $L_{13}$ may be determined in accordance to the following equations:

$$L_{13} = 1/(\Omega_o)^2 \times C, \text{ where } C = M_{13} \times (C_1 \times C_3) \quad \text{Equation (4),}$$

$$C_L = \frac{1}{4} \times M_{13} \times (C_1 \times C_3)^{1/2} \quad \text{Equation (5),}$$

wherein M13 is derived from a generalized coupling matrix.

Figure 11:
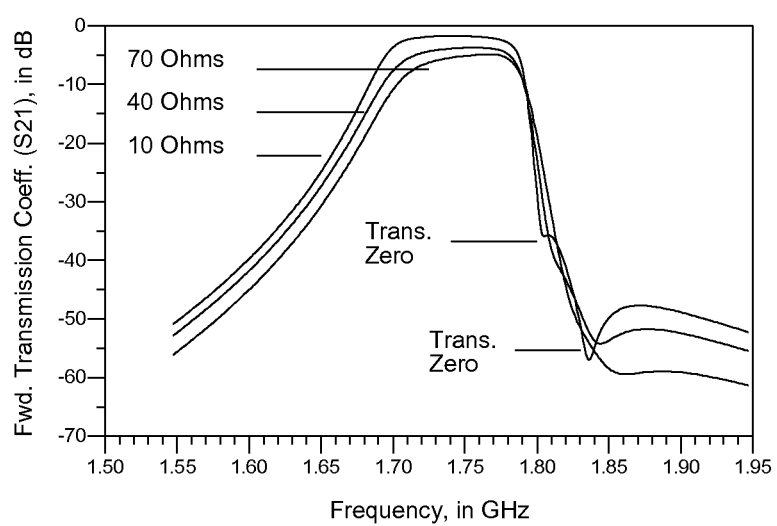
FIGS. 11-14 depict example plots related to the tunable phase shifter disclosed herein.

FIG. 11 depicts the filter response for the band filter 1000 (depicted at FIG. 10) having two transmission zeros. The transmission zeros, in this example, may be non-coincident. The flexibility in tuning the transmission zeros may enable features, such as blocker cancellation and enhanced selectivity. Passive inductors may be configured for high quality (high-Q) performance, which may include mitigating power losses in the inductor.

The proposed tunable inductors may employ switches and may thus incur a power loss due to the use of switches. The selectivity rate may, however, remain relatively constant, when assuming a wide/gross range of resistive values. In-band insertion loss may degrade with increased switch resistance, but the out-of-band rejection may also improve, in tandem.

Figure 12:
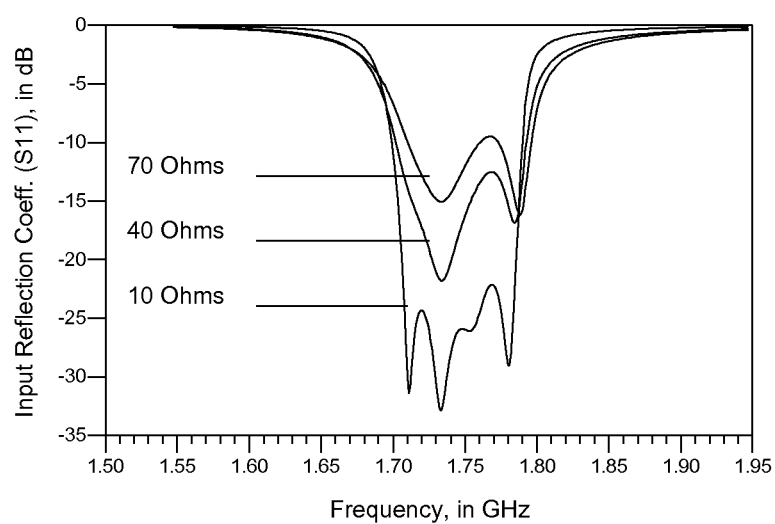

FIG. 12 depicts a plot of the input power matching of the band filter 1000. Although switch resistance degrades the matching performance, the bandwidth of the matching may remain relatively constant.

In the case of a cross-coupled bandpass filter, the transmission zeros may be tuned by coarsely adjusting the characteristic impedance of the transmission lines that embody the phase shifter. For the band filter 1000 example depicted at FIG. 10, equal characteristic impedances for both $L_{13}$ and $L_{35}$ inductors may allow the two transmission zeros to be co-incident.

Figure 13:
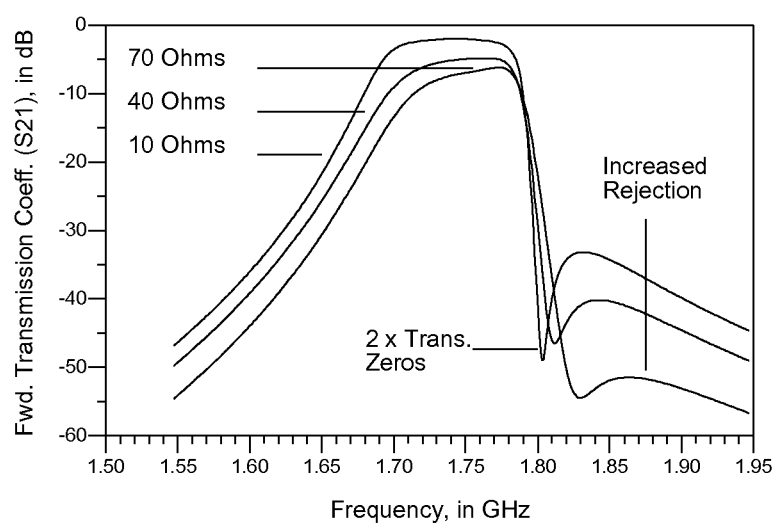

FIG. 13 plots the forward transmission of the band filter 1000 example depicted at FIG. 10 with co-incident transmission zeros. FIG. 13 shows that the selectivity rate may only slightly degrade with increased resistance, which may be similar to the separated transmission zero example noted above. The exact location of the transmission zeros may not vary with resistance but may be finely adjusted via tuning capacitors (for example, capacitors 1018A-1018B at FIG. 10).

Figure 14:
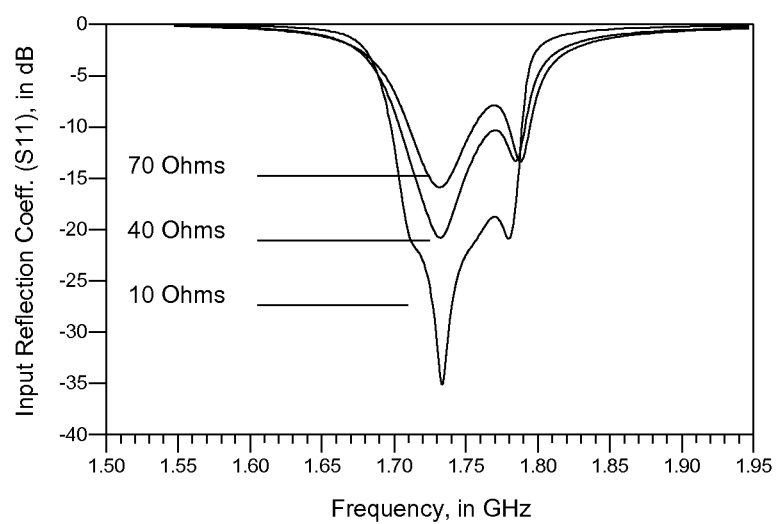

FIG. 14 depicts a plot illustrating input power matching performances for the co-incident nulls scenario, and that it yields the same operational trend as the non-co-incident scenario. Therefore, the phase shifters disclosed herein may be used to form tunable inductor components for tunable front-end filters, for example.

Figure 15:
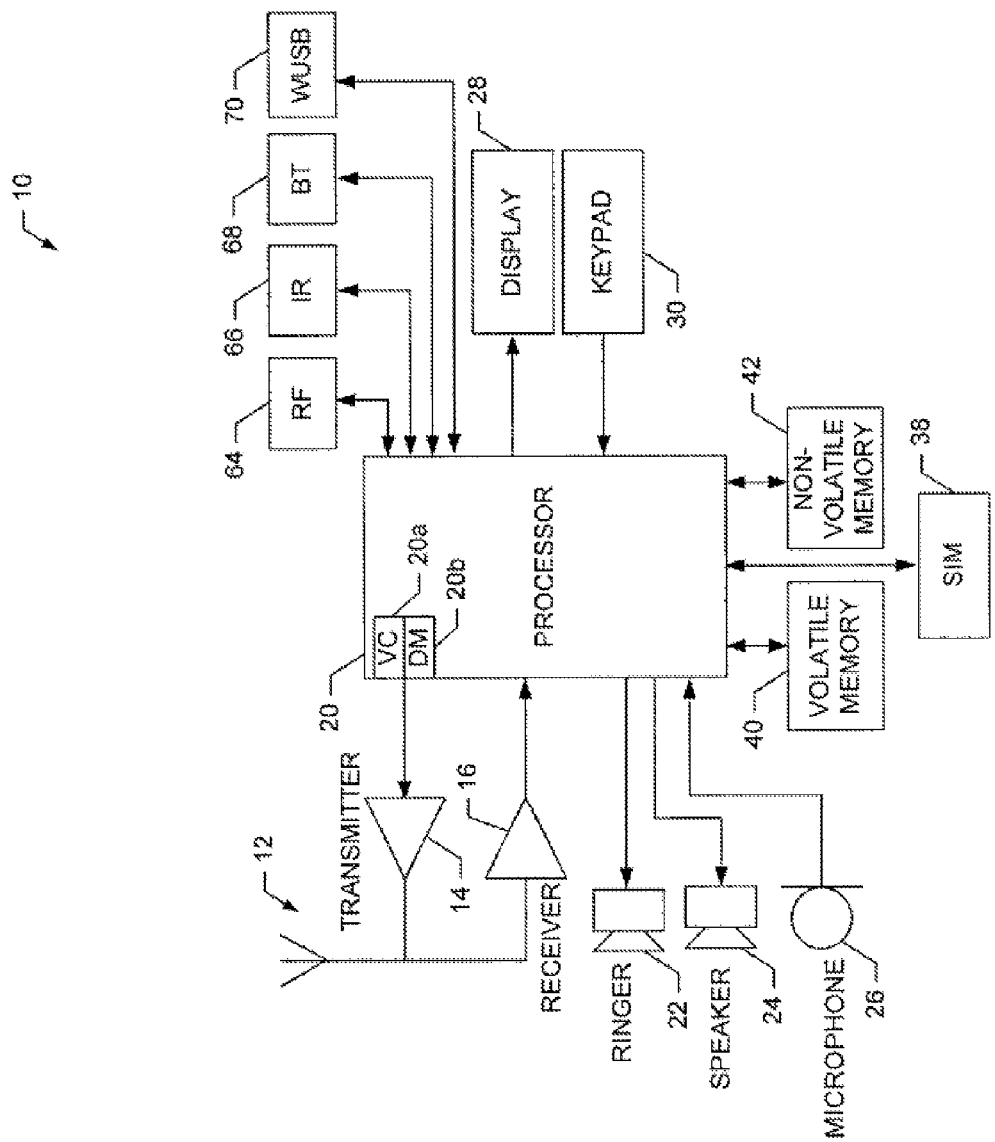
FIG. 15 depicts an example of a radio, in accordance with some example embodiments.
Figure 16:
FIG. 16 depicts a typical switched-line phase shifter configured to select one of two transmission lines to perform coarse phase shifting.

FIG. 15 illustrates a block diagram of an apparatus 10, in accordance with some example embodiments. For example, apparatus 10 may comprise a user equipment, such as a smart phone, smart object, mobile station, a mobile unit, a subscriber station, a wireless terminal, a tablet, a wireless plug-in accessory, or any other wireless device.

The apparatus 10 may include at least one antenna 12 in communication with a transmitter 14 and a receiver 16. Alternatively transmit and receive antennas may be separate. The tunable phase shifters disclosed herein may, in some example, embodiments, be used to provide a tunable filter at for example transmitter 14 and/or as a duplexer between the receiver 16 and transmitter 14.

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 15 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20a, an internal data modem (DM) 20b, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 15, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth (BT) transceiver 68 operating using Bluetooth wireless technology, a wireless universal serial bus (USB) transceiver 70, a Bluetooth Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the WiFi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), an eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing functions of the user equipment/mobile terminal. The memories may comprise an identifier, such as an international mobile equipment identification (IMEI) code, capable of uniquely identifying apparatus 10. The functions may include one or more of the operations disclosed with respect to controlling and/or providing the phase shifters and/or tunable filters disclosed herein. The memories may comprise an identifier, such as an international mobile equipment identification (IMEI) code, capable of uniquely identifying apparatus 10. In the example embodiment, the processor 20 may be configured using computer code stored at memory 40 and/or 42 to provide operations disclosed herein with respect to the phase shifter and/or tunable filters disclosed herein.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 15, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing below, a technical effect of one or more of the example embodiments disclosed herein is tunable bandpass filters with for example tunable transmission zeros located on the high-side of the filter.

If desired, the different functions discussed herein may be performed in a different order and/or concurrently with each other. Furthermore, if desired, one or more of the above-described functions may be optional or may be combined. Although various aspects of the invention are set out in the independent claims, other aspects of the invention comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of the present invention as defined in the appended claims. Other embodiments may be within the scope of the following claims. The term "based on" includes "based on at least." The use of the phase "such as" means "such as for example" unless otherwise indicated.

What is claimed:

1. An apparatus comprising:
    a transmission line comprising a plurality of transmission line sections coupled between a radio frequency input and a radio frequency output through a plurality of switches,
    wherein the plurality of switches are coupled between the plurality transmission line sections and configured selectively to provide at least one cross-coupled connection and at least one series-coupled connection between the plurality of transmission line sections, wherein the plurality of switches are selectively activated to vary an impedance and a phase shift of the transmission line, wherein the plurality of switches, when selectively activated, provide a coarse adjustment to the impedance and the phase shift, and wherein a fine adjustment to the impedance is provided by adjusting at least one variable capacitor coupled to the plurality of switches.

2. The apparatus of claim 1, wherein each of the plurality of transmission line sections have the same shape.

3. The apparatus of claim 1, wherein the at least one cross-coupled connection and at least one series-coupled connection are selected by a switch controller.

4. The apparatus of claim 1, wherein the plurality of transmission line sections form a periodic structure.

5. The apparatus of claim 2, wherein the same shape is substantially circular.

6. The apparatus of claim 1, wherein the plurality of switches provide a coarse adjustment to the impedance provided by the transmission line.

7. The apparatus of claim 1, wherein the plurality of switches provide a coarse adjustment to the phase shift provided by the transmission line.

8. The apparatus of claim 1, wherein the plurality of transmission line sections further comprise a continuous conductive material.

9. A method comprising:
coupling a plurality of transmission line sections of a transmission line, wherein the plurality of transmission line sections are coupled between an radio frequency input and an radio frequency output through a plurality of switches; and
selectively activating the plurality of switches to vary an impedance and a phase shift of the transmission line, wherein the plurality of switches are coupled between the plurality transmission line sections and configured to selectively provide at least one cross-coupled connection and at least one series-coupled connection between the plurality of transmission line sections, wherein the plurality of switches are selectively activated to vary an impedance and a phase shift of the transmission line, wherein the plurality of switches, when selectively activated, provide a coarse adjustment to the impedance and the phase shift, and wherein a fine adjustment to the impedance is provided by adjusting at least one variable capacitor coupled to the plurality of switches.

10. The method of claim 9, wherein each of the plurality of transmission line sections have the same shape.

11. The method of claim 9, wherein the at least one cross-coupled connection and at least one series-coupled connection are selected by a switch controller.

12. The method of claim 9, wherein the plurality of transmission line sections form a periodic structure.

13. The method of claim 10, wherein the same shape is substantially circular.

14. The method of claim 9, wherein the plurality of switches provide a coarse adjustment to the impedance provided by the transmission line.

15. The method of claim 9, wherein the plurality of switches provide a coarse adjustment to the phase shift provided by the transmission line.

16. The method of claim 9, wherein the plurality of transmission line sections further comprise a continuous conductive material.

17. A non-transitory computer readable storage medium including code which when executed by at least one processor provides operations comprising:
coupling a plurality of transmission line sections of a transmission line, wherein the plurality of transmission line sections are coupled between an radio frequency input and an radio frequency output through a plurality of switches; and
selectively activating the plurality of switches to vary an impedance and a phase shift of the transmission line, wherein the plurality of switches are coupled between the plurality transmission line sections and configured to selectively provide at least one cross-coupled connection and at least one series-coupled connection between the plurality of transmission line sections, wherein the plurality of switches are selectively activated to vary an impedance and a phase shift of the transmission line, wherein the plurality of switches, when selectively activated, provide a coarse adjustment to the impedance and the phase shift, and wherein a fine adjustment to the impedance is provided by adjusting at least one variable capacitor coupled to the plurality of switches.

* * * * *